United States Patent
Lee et al.

(10) Patent No.: US 7,322,736 B2
(45) Date of Patent: Jan. 29, 2008

(54) LED POSITIONING STRUCTURE

(75) Inventors: Ming-Shun Lee, Taipei (TW); Wen-Fa Kuo, Taipei (TW)

(73) Assignee: Taiwan Oasis Technology Co., Ltd., Taipei (TW)

( * ) Notice: Subject to any disclaimer, the term of this patent is extended or adjusted under 35 U.S.C. 154(b) by 125 days.

(21) Appl. No.: 11/230,611

(22) Filed: Sep. 21, 2005

(65) Prior Publication Data
US 2007/0063323 A1 Mar. 22, 2007

(51) Int. Cl.
*H01R 33/00* (2006.01)

(52) U.S. Cl. ............... 362/655; 361/820; 362/311; 362/363

(58) Field of Classification Search ........... 362/226, 362/363, 655, 311; 361/380, 363, 820; 439/56
See application file for complete search history.

(56) References Cited

U.S. PATENT DOCUMENTS

| | | | | |
|---|---|---|---|---|
| 4,398,240 A | * | 8/1983 | Savage, Jr. ............... | 362/311 |
| 4,471,414 A | * | 9/1984 | Savage, Jr. ............... | 362/652 |
| 4,667,270 A | * | 5/1987 | Yagi ........................ | 361/820 |
| 5,126,929 A | * | 6/1992 | Cheselske ................ | 362/363 |
| 5,709,554 A | * | 1/1998 | Savage, Jr. ............... | 439/56 |

* cited by examiner

*Primary Examiner*—Sandra O'Shea
*Assistant Examiner*—James W Cranson, Jr.
(74) *Attorney, Agent, or Firm*—Troxell Law Office, PLLC (57) ABSTRACT

An improved LED positioning structure includes a retaining holder and a cover; multiple slots being disposed on one side of the retaining holder; a slope externally extending beneath each slot gradually and externally extending a slope; a hole connecting through each slot being formed on the bottom of the slope; a positioning channel at the top of the retaining holder for LED pins to respectively penetrate each hole, thus each pin being placed in a slot; a bent part of each pin being formed by the curvature located between the slot and the positioning channel to position the LED mask in the positioning channel; and the cover being positioned at top of the slot to secure the LED in place.

10 Claims, 9 Drawing Sheets

LED POSITIONING STRUCTURE

BACKGROUND OF THE INVENTION (a) Field of the Invention

The present invention is related to an improvement of a positioning structure, and more particularly, to one that precisely secures a light emitting diode (LED) on a circuit board without causing any inclination.

(b) Description of the Prior Art

Usually, the mask of an LED is directly inserted into a preset hole while plugging electronic parts onto a circuit board. The holder of the LED frequently fails to align at the hole and it takes to return the holder back to its original location. As a result, short circuit frequently happens since the constant displacement could easily cause the LED pins to break up or get tangled among one another.

Figure 1:
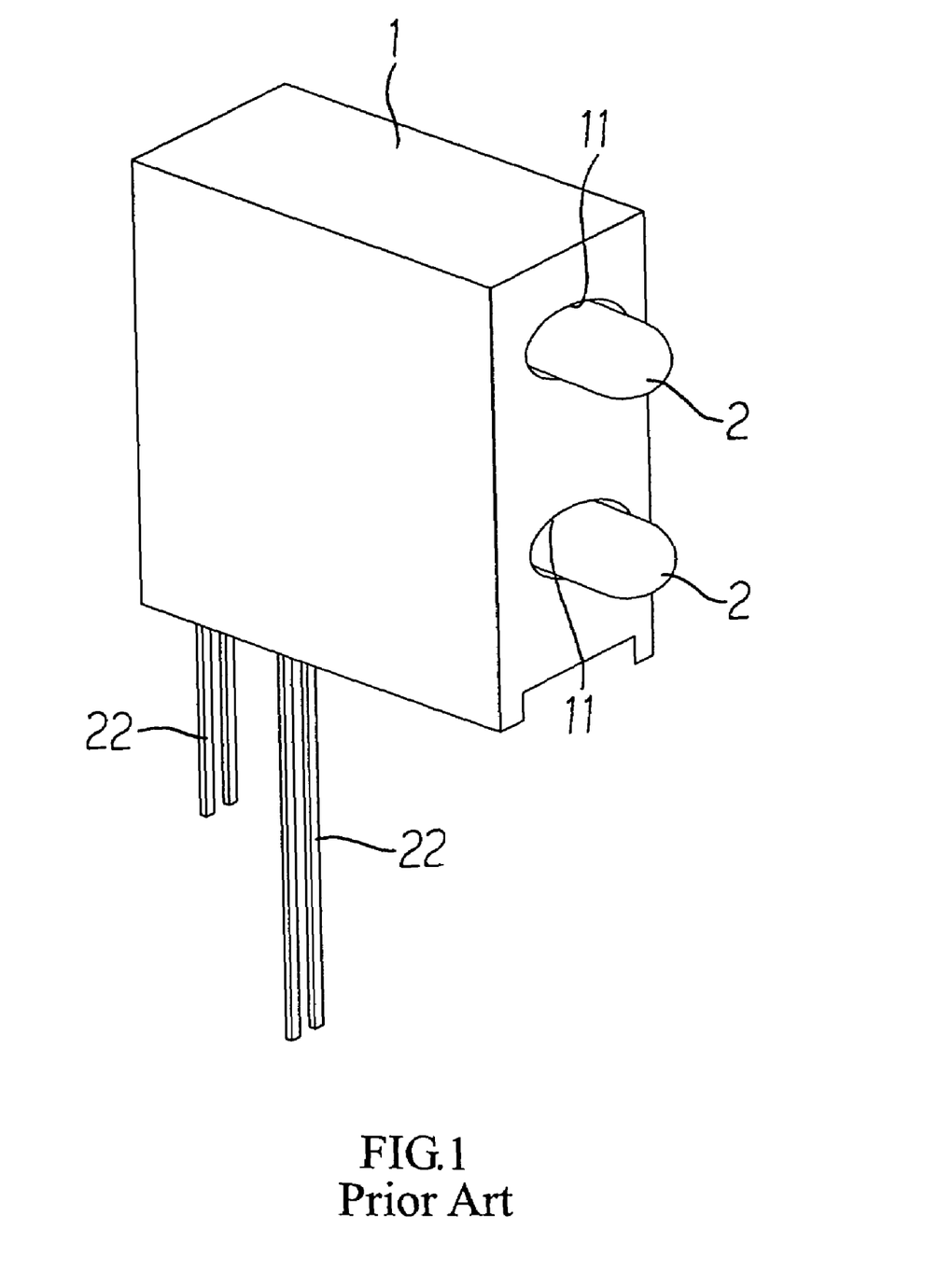
FIG. 1 is a schematic view showing an appearance of an LED adaptation holder of the prior art.
Figure 2:
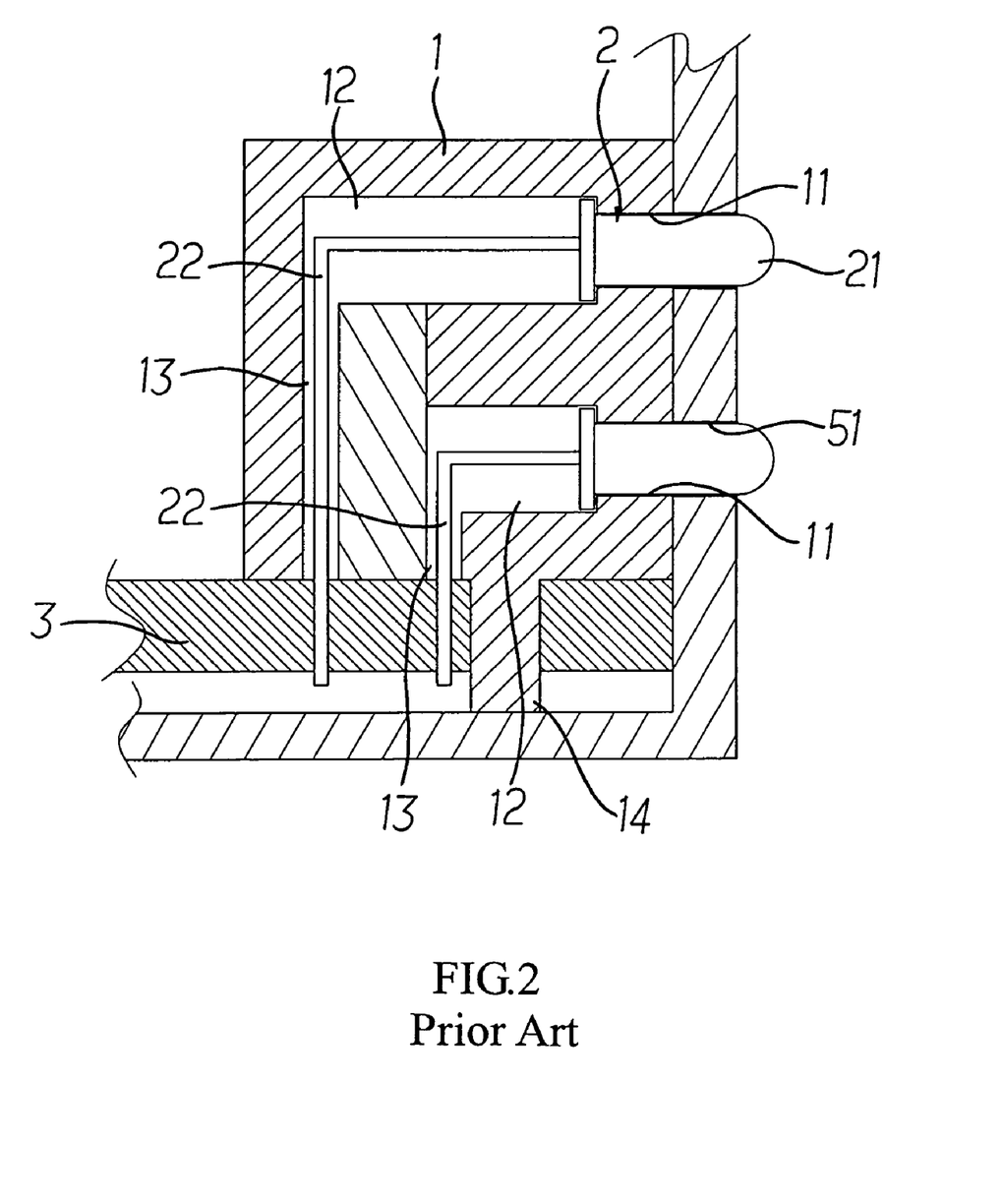
FIG. 2 is a sectional view of the LED adaptation holder of the prior art.

As illustrated in FIGS. 1 and 2, a holder to protect the LED was available in the market. It relates to a rectangular holder 1. An opening 11 to accommodate a mask 21 is provided on one side of the holder 1; multiple holes 12 are laterally disposed below the opening 11; multiple pin slots 13 are provided inside the rear of the holder 1 and connected through those holes 12; and two pillars protrude from the bottom of the holder 1.

When assembled, the mask 21 of the LED is received in the opening 11; and LED pins 22 penetrate through their respective holes 12 then bent to stay flushed in the pin slot 13 to protect where the pin 22 connecting to the mask 21 from being subject to impact. However, when those pillars 14 are planted on a circuit board 3 and the LED mask fails to align at a hole preset for light emission, the holder 1 for being made in rectangular shape is vulnerable to lean to one side when subject to external force, thus to even push the mask farther from its designated place for light emission. Therefore, rework is required at the costs of extra work hours and deformed pins.

SUMMARY OF THE INVENTION

The primary purpose of the present invention is to provide a positioning structure that precisely positions the LED on the circuit board without causing any inclination.

To achieve the purpose, the present invention is essentially comprised of a retaining holder and a cover. Multiple slots are provided on one side of the retaining holder; a slope externally extends below each slot; a hole connecting through the slot is formed at the bottom of the slope; multiple positioning members are disposed at the bottom of the retaining holder; and a positioning channel is provided at the top of the retaining holder. LED pins respectively penetrate into their respectively holes while each pin is placed into a slot and bent at where the slot connects the positioning channel to secure the LED mask in the positioning channel. Finally, the cover is placed upon the top of the positioning channel to secure the LED in position while the LED penetrates and mounted on a pre-designated location by means of those positioning members disposed at the bottom of the retaining holder.

DETAILED DESCRIPTION OF THE PREFERRED EMBODIMENTS

Figure 3:
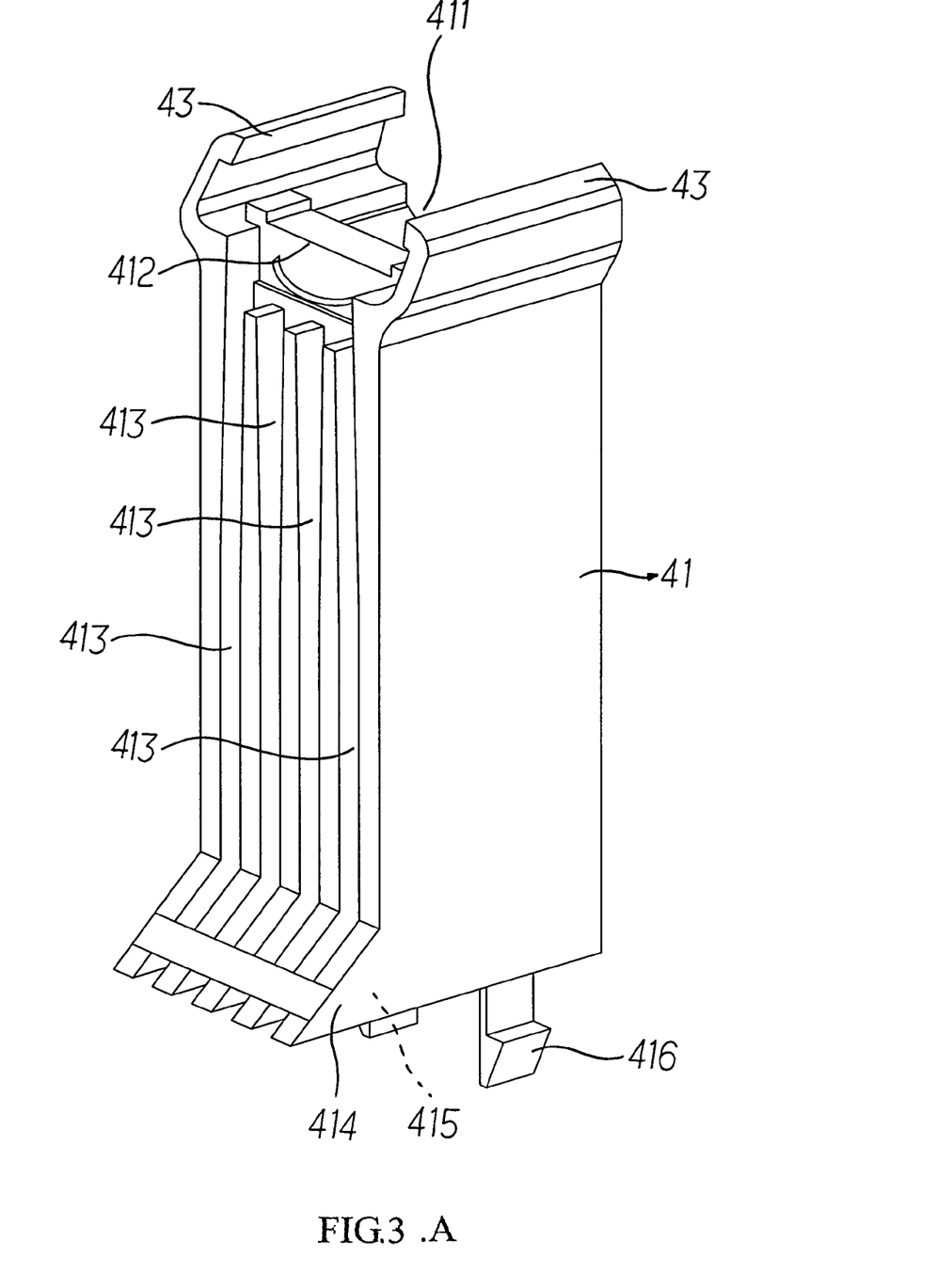
FIG. 3(A) is a perspective view showing a retaining holder in an LED positioning structure of the present invention.
FIG. 3(B) is a perspective view showing a cover in an LED positioning structure of the present invention.
Figure 4:
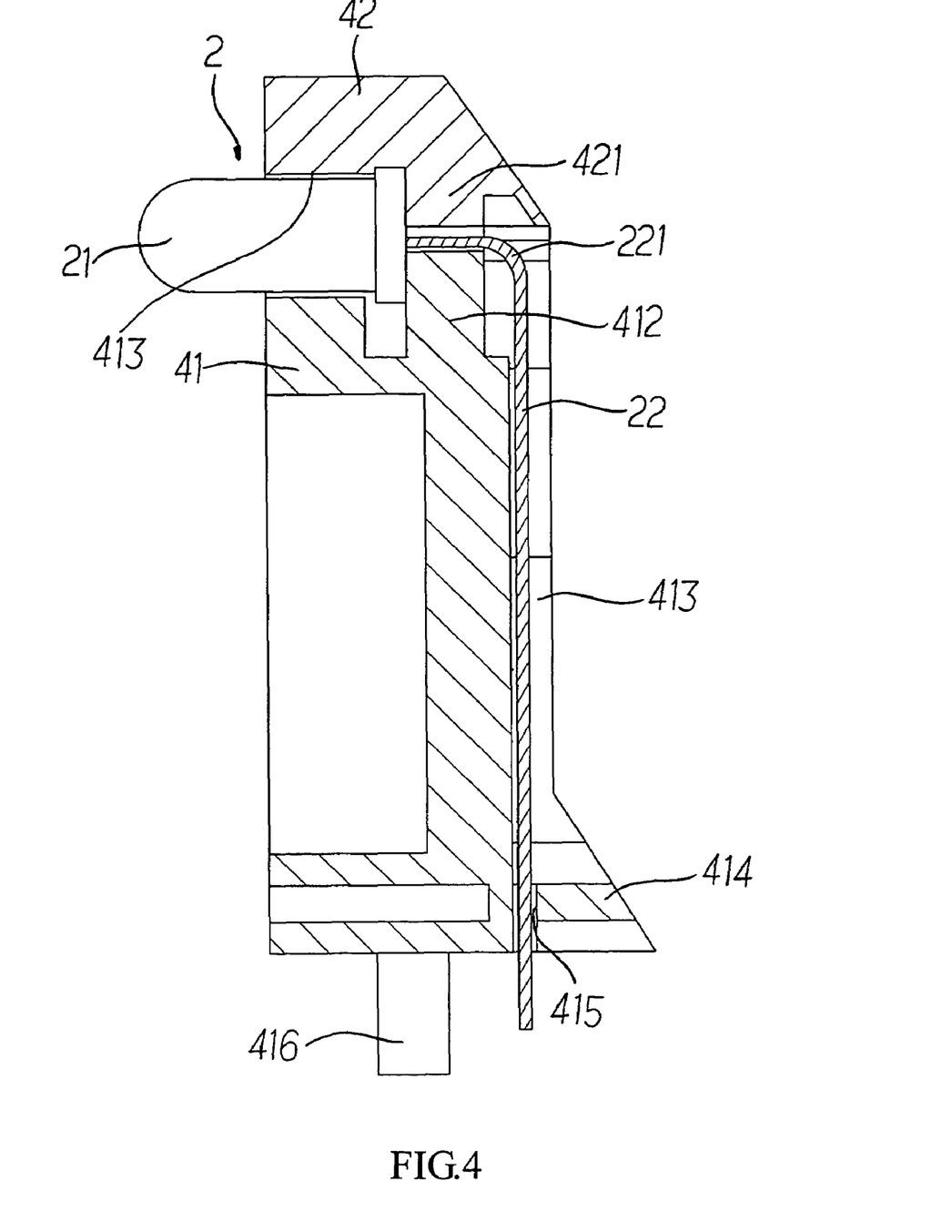
FIG. 4 is a schematic view showing that the LED is secured in the positioning structure of the present invention.

Referring to FIGS. 3(A), 3(B), and 4, an LED positioning structure 4 of the present invention is essentially comprised of a retaining holder 41 and a cover 42. A positioning channel 411 is disposed at the top of the retaining holder; and a guard 412 is provided in the positioning channel 411. Multiple slots 413 are provided on one side of the retaining holder 41; a slope externally extends below each slot 413; a hole 415 connecting through the slot 413 is disposed at the bottom of the slope 414; and multiple positioning members 416 are disposed at the bottom of the retaining holder 41. The cover 42 is disposed on top of the positioning channel 411, and another guard 421 is disposed in the cover.

Figure 5:
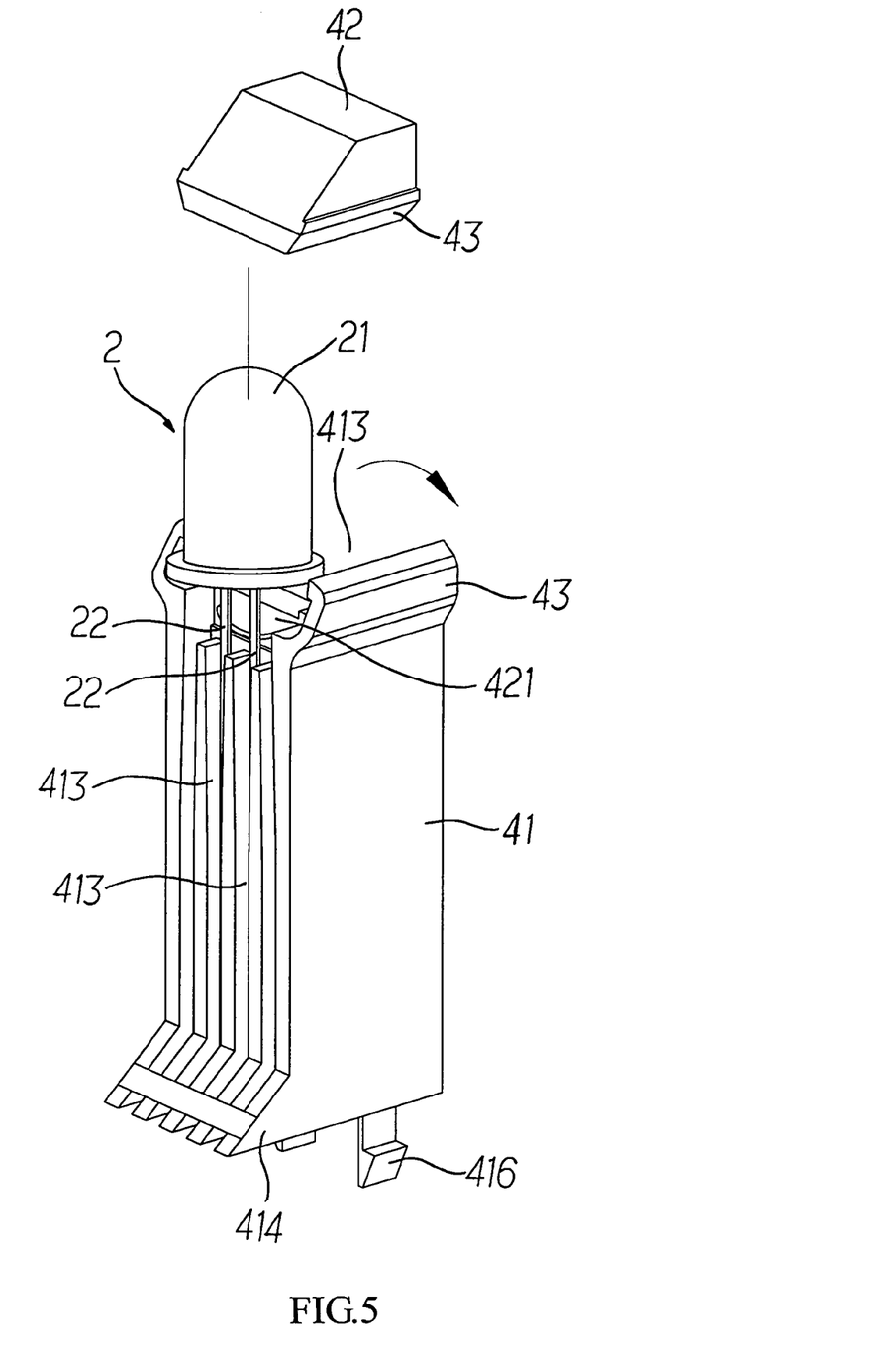
FIG. 5 is an exploded view of the LED positioning structure of the present invention.
Figure 6:
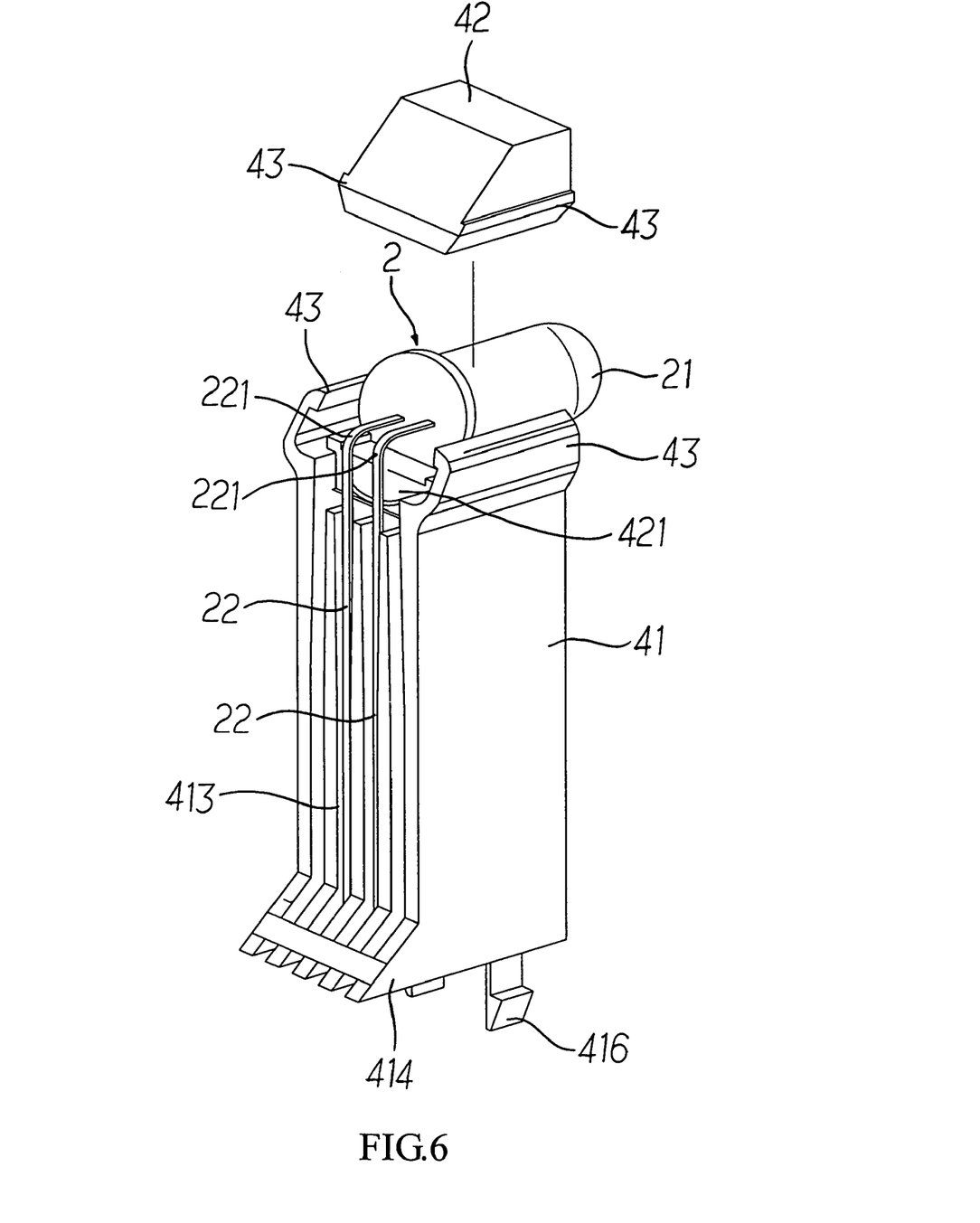
FIG. 6 is another exploded view of the LED positioning structure of the present invention.
Figure 7:
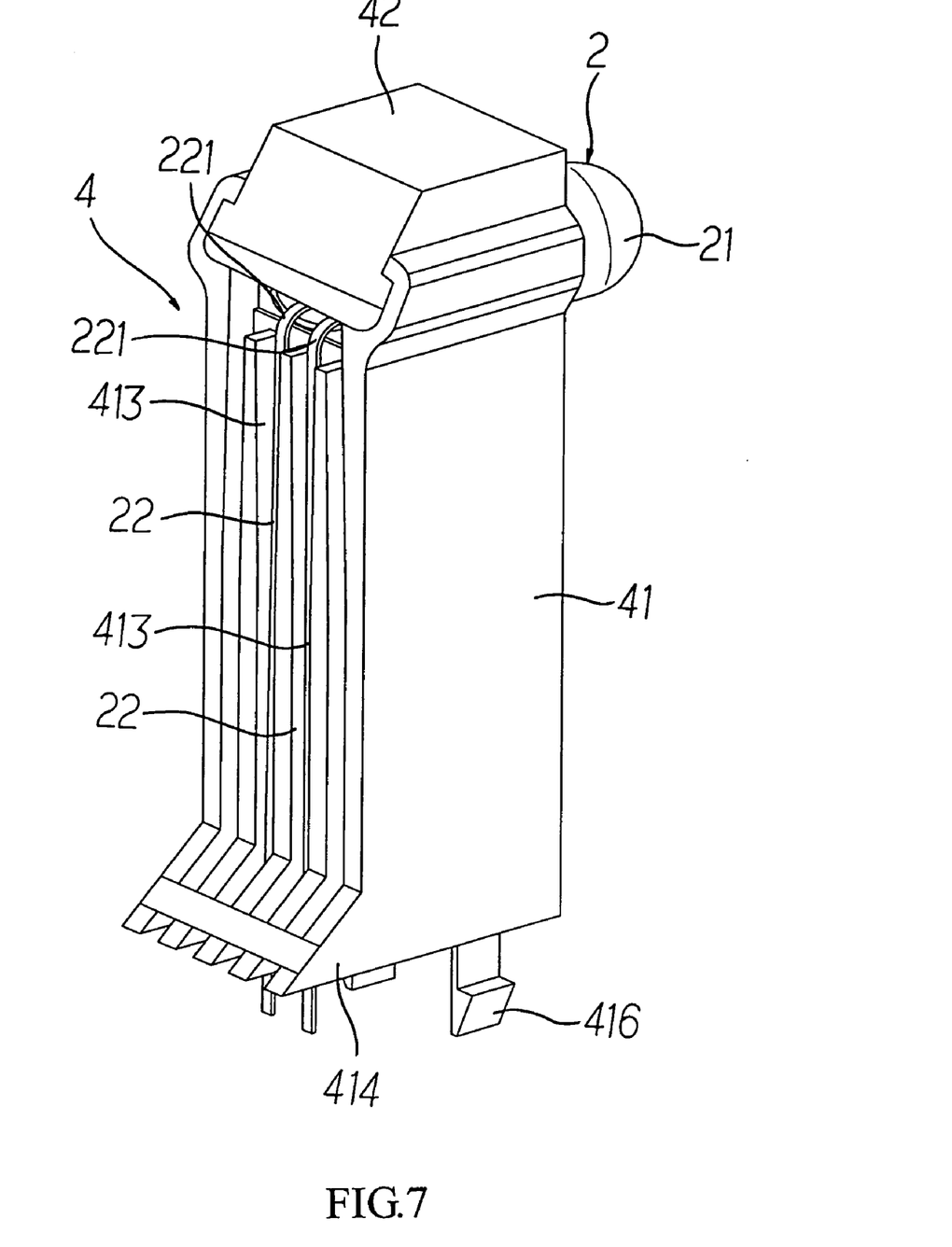
FIG. 7 is a perspective view of the LED positioning structure of the present invention.

When assembled as illustrated in FIGS. 4 and 5, multiple pins 22 of an LED 2 are respectively inserted into corresponding holes 415 for each pin 22 to stay flushed in each slot 413. A curve 221 is formed to each pin 22 at where the slot 413 contacts the positioning channel 411 as illustrated in FIG. 6 for a mask 21 of the LED 2 to be secured in the positioning channel 411 while the guards 412, 421 serve the positioning stopper for the LED 2 and for the separation from those pins 22. A latching member 43 disposed between the positioning channel 411 and the cover 42 locks up both of the positioning channel 411 and the cover 42 to precisely secure the LED 2 at where between the retaining holder 41 and the cover 42. As illustrated in FIG. 7, the positioning member 416 is made in the form of a latching member disposed at the bottom of the retaining holder 41, and the LED 2 passes through a pre-designated location on the circuit board 3 by means of the positioning member 416. Meanwhile, the mask 21 of the LED 2 protrudes from the positioning channel 411 to become side light emission such that the bottom area is increased due to the slope 414 provided on one side of the retaining holder 41, but also the positioning structure 4 in general will be kept straight without inclination by resting upon the slope 414. Accordingly, the mask 21 of the LED 2 is exactly aligned at a hole 51 preset for light emission to achieve easy assembly and reliable positioning results.

Figure 8:
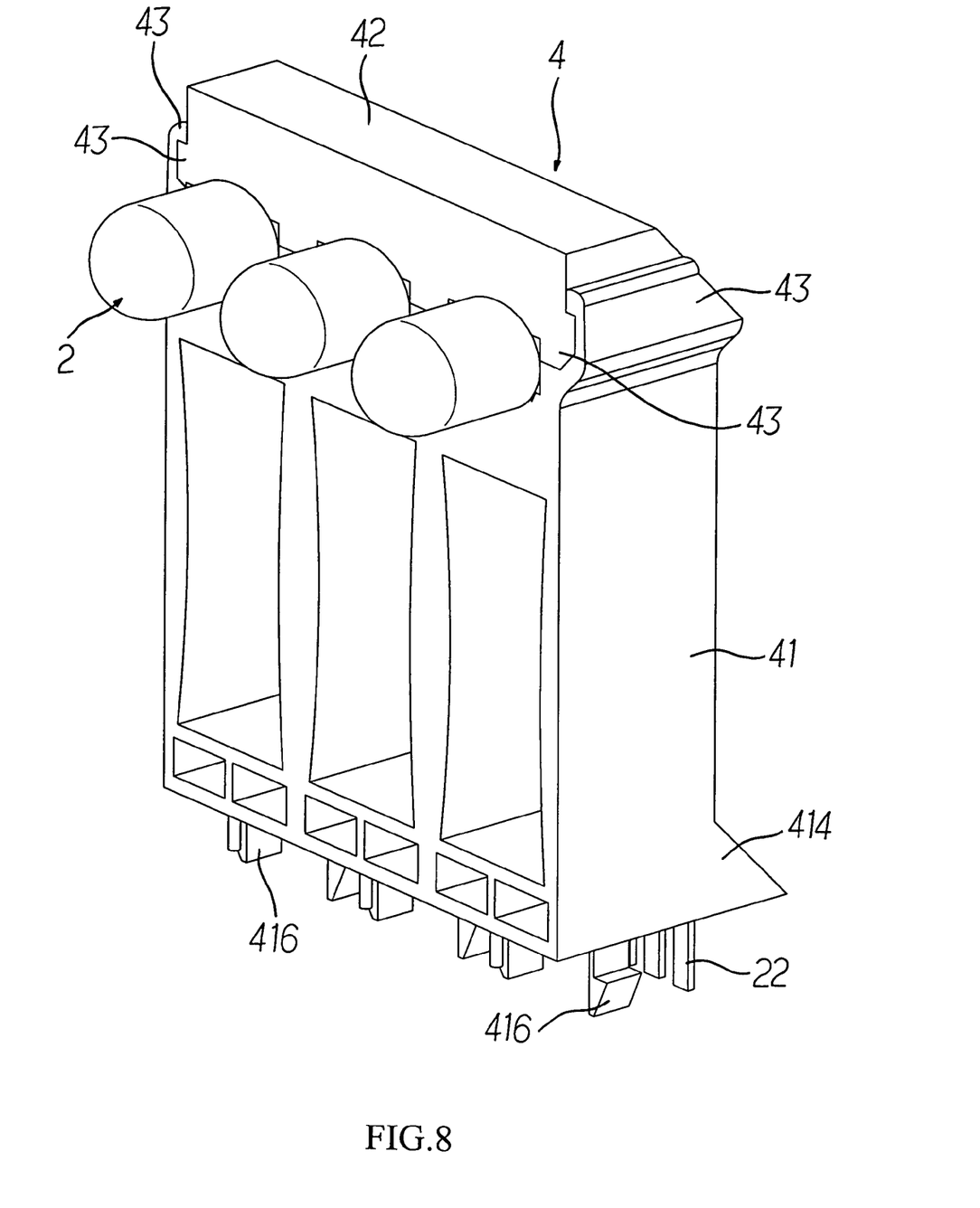
FIG. 8 is another perspective view of the LED positioning structure of the present invention.

Furthermore, the positioning structure 4 is made in the form as illustrated in FIG. 8. Wherein, multiple LEDs 2 are secured in position by means of the positioning channel 411; and each LED 2 is precisely held in position at where between the retaining holder 41 and the cover 2 by having both of the positioning channel 411 and the cover 42 to be latched to each other. The retaining holder 41 latched to the cover 42 is then secured in a pre-designated location on the circuit board 3 by means of those positioning members 416 to complete an LED module.

The prevent invention provides an improved LED positioning structure, and the application for a utility patent is duly filed accordingly. However, it is to be noted that that the preferred embodiments disclosed in the specification and the accompanying drawings are not limiting the present invention; and that any construction, installation, or characteristics that is same or similar to that of the present invention should fall within the scope of the purposes and claims of the present invention.

We claim:

1. An LED positioning structure comprising: a retaining holder and a cover; a positioning channel being provided on the top of the retaining holder; multiple slots being disposed on one side of the retaining holder; a slope externally extending from where below each slot; a hole connecting through each slot being formed at the bottom of the slope; multiple positioning members being disposed at the bottom of the retaining holder; and the cover being placed on the top of the positioning channel.

2. An LED positioning structure comprising: a retaining holder and a cover; multiple slots being disposed on one side of the retaining holder; a slope extending externally from where below each slot; a hole connecting through each slot being formed at the bottom of the slope; multiple positioning members being disposed at the bottom of the retaining holder; a positioning channel being provided on the top of the retaining an LED each of multiple pins of the LED respectively penetrating the hole and placed in each slot; a curve of the pin being formed at where the slot contacts the positioning channel; an LED mask being secured in the positioning channel; and the cover being placed on top of the positioning channel to secure the LED.

3. The LED positioning structure of claim 1, wherein a guard is disposed in the positioning channel.

4. The LED positioning structure of claim 2, wherein a guard is disposed in the positioning channel.

5. The LED positioning structure of claim 1, wherein a guard is disposed in the cover.

6. The LED positioning structure of claim 1, wherein a latching member is disposed between the positioning channel and the cover.

7. The LED positioning structure of claim 2, wherein a latching member is disposed between the positioning channel and the cover.

8. The LED positioning structure of claim 1, wherein the positioning member is made in the form of a latching member.

9. The LED positioning structure of claim 2, wherein the positioning member is made in the form of a latching member.

10. The LED positioning structure of claim 2, wherein multiple LEDs are secured in the positioning channel to form an LED module.

* * * * *